United States Patent
Guevara (10) Patent No.: US 12,107,062 B2
(45) Date of Patent: Oct. 1, 2024

(54) SEMICONDUCTOR DEVICE WITH SOLDER ON PILLAR

(71) Applicant: Texas Instruments Incorporated, Dallas, TX (US)

(72) Inventor: Rafael Jose Guevara, Metro Manila (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 4 days.

(21) Appl. No.: 17/694,995

(22) Filed: Mar. 15, 2022

(65) Prior Publication Data
US 2023/0299031 A1    Sep. 21, 2023

(51) Int. Cl.
*H01L 23/00* (2006.01)
*H01L 23/498* (2006.01)

(52) U.S. Cl.
CPC .............. *H01L 24/13* (2013.01); *H01L 24/05* (2013.01); *H01L 24/11* (2013.01); *H01L 24/16* (2013.01); *H01L 23/49822* (2013.01); *H01L 2224/02381* (2013.01); *H01L 2224/0239* (2013.01); *H01L 2224/05691* (2013.01); *H01L 2224/11005* (2013.01); *H01L 2224/11009* (2013.01); *H01L 2224/11849* (2013.01); *H01L 2224/13019* (2013.01); *H01L 2224/13024* (2013.01); *H01L 2224/13553* (2013.01); *H01L 2224/13575* (2013.01); *H01L 2224/16227* (2013.01); *H01L 2224/16245* (2013.01); *H01L 2924/381* (2013.01); *H01L 2924/3841* (2013.01)

(58) Field of Classification Search
CPC ......... H01L 24/13; H01L 24/05; H01L 24/11; H01L 24/16; H01L 2924/381; H01L 2924/43841; H01L 23/49822; H01L 2224/02381; H01L 2224/0239; H01L 2224/05691; H01L 2224/11005; H01L 2224/11009; H01L 2224/11849; H01L 2224/13019; H01L 2224/13024; H01L 2224/13553; H01L 2224/13575; H01L 2224/16227; H01L 2224/16245; H01L 24/12; H01L 24/28; H01L 2224/1304; H01L 2224/1302; H01L 2224/13021; H01L 2224/13022
See application file for complete search history.

(56) References Cited

U.S. PATENT DOCUMENTS

| | | | |
|---|---|---|---|
| 11,990,439 B2* | 5/2024 | Lee | H01L 23/528 |
| 2011/0233746 A1* | 9/2011 | Liu | H01L 24/73 257/676 |
| 2012/0225522 A1* | 9/2012 | Zhao | H01L 23/49816 438/107 |

(Continued)

*Primary Examiner* — Karen Kusumakar
*Assistant Examiner* — Shawn Shaw Muslim
(74) *Attorney, Agent, or Firm* — Ronald O. Neerings; Frank D. Cimino (57) ABSTRACT

A semiconductor die includes a substrate including a semiconductor surface including circuitry electrically connected to die bond pads that include a first die bond pad exposed by a passivation layer, a top dielectric layer over the passivation layer, and a metal layer electrically connected to the first die bond pad. A pillar is on the metal layer over the first die bond pad, and a solder cap is on a top side of the pillar. The solder cap includes an essentially vertical sidewall portion generally beginning at a top corner edge of the pillar.

20 Claims, 6 Drawing Sheets

(56) References Cited

U.S. PATENT DOCUMENTS

| | | | |
|---|---|---|---|
| 2021/0134750 A1 | 5/2021 | Manack et al. | |
| 2021/0335701 A1* | 10/2021 | Lin | H01L 24/14 |
| 2022/0028842 A1* | 1/2022 | Chang | H01L 23/367 |
| 2023/0154878 A1* | 5/2023 | Hu | H01L 24/13 |
| | | | 257/738 |
| 2023/0187340 A1* | 6/2023 | Park | H01L 23/5223 |
| | | | 257/532 |
| 2023/0197776 A1* | 6/2023 | Mun | H01L 23/53295 |
| | | | 257/506 |

* cited by examiner

SEMICONDUCTOR DEVICE WITH SOLDER ON PILLAR

FIELD

This Disclosure relates to semiconductor devices having pillars on bond pads, with solder on the pillars.

BACKGROUND

One semiconductor technology is known as "wafer level chip scale packaging" with the packages known as wafer level chip scale packages ("WCSPs"), which are also known as WCSP die. Using a WCSP, unpackaged semiconductor dies without any surrounding layer of protective encapsulation such as a mold compound, are generally mounted on printed circuit boards (PCB). The structures needed for electrical connection of a WCSP to a PCB are usually fabricated on one surface of the semiconductor die while the plurality of semiconductor die are still integrally connected together on a single wafer.

For example, in a conventional form of WCSP, various layers including contact pads and then solder bumps thereon are formed on respective dies at the wafer level. For this purpose, at least one redistribution layer (RDL) is used which is an extra metal layer on a semiconductor die above the top metal layer that makes the input/output (I/O) pads of an integrated circuit (IC) available in other locations. After wafer singulation the WCSP may be attached, solder bumped top side down, onto a PCB. WCSPs have the advantage of being considerably smaller in size as compared to conventionally packaged IC dies and are thus suited for certain applications, such as cellular phones and digital tablets, where the associated PCB is often constrained to have a small footprint.

Figure 1:
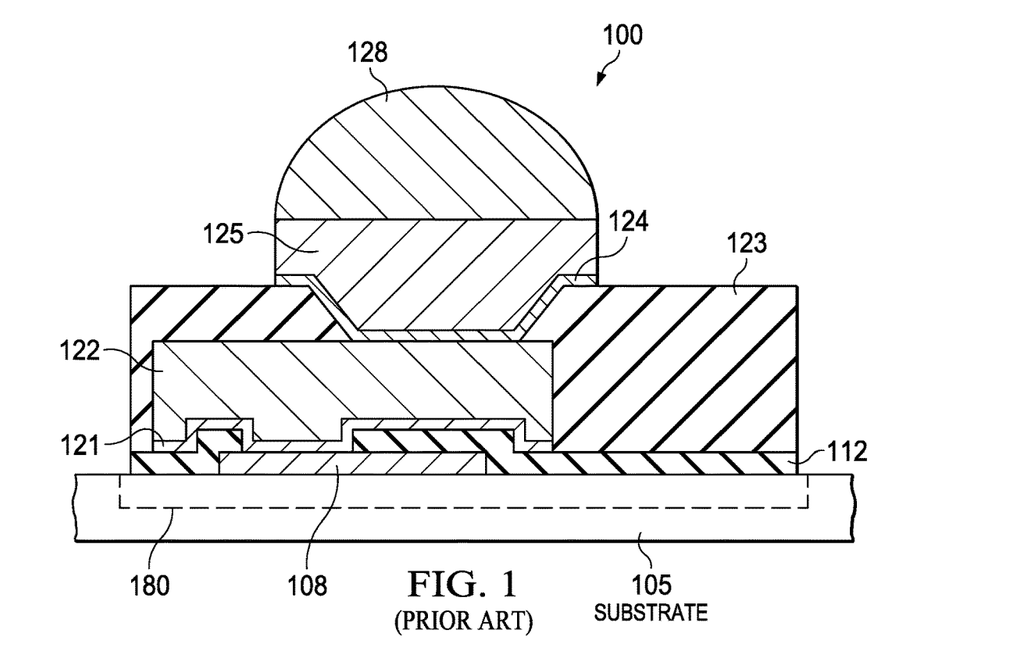
FIG. 1 shows a portion of conventional WCSP shown as a BOPCOA structure including a solder ball on a pillar for an electrical connection to the bond pads of the WCSP.

FIG. 1 shows a portion of conventional WCSP 100 shown as a bump on pad copper on anything (BOPCOA) structure including a solder ball 128 for an electrical connection to the bond pads 108 of the WCSP 100. A passivation (overcoat) layer 112 is generally formed in the wafer fabrication facility over the top metal layer that includes the bond pads 108, where the passivation layer 112 includes apertures to expose the bond pads 108 that are electrically connected to nodes in the circuitry 180. There are 3 additional layers described below (besides the seed layers) that electrically contact the bond pad 108 which are added on top of the passivation layer 112 that is performed during the wafer level bump processing.

There is a first seed layer 121 under a RDL 122 that generally comprises copper, and a dielectric layer 123 typically comprising a polyamide (PI) that is on the RDL 122. There is a second seed layer 124 above the dielectric layer 123. There is pillar 125 on the second seed layer 124, and a solder ball 128 (also called a solder cap) on top of the pillar 125. In the case of a flipchip on lead device, such as a flipchip quad flat no lead (QFN) package, the pillar 125 is generally substantially taller (such as 50-100 µm) as compared to the pillar height in the case of a WCSP 100 (such as 10-30 µm). The solder ball 128 can be seen to have a conventional hemispherical geometry throughout that flattens slightly after reflow.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for forming solder balls a mount stud on stencil is conventionally used for ball drop purposes. For smaller sized die, a mount stud is defined to be within the die to avoid alignment offsets. However, for smaller and more aggressive die layouts that have solder ball placement relatively close together, such as a ball to ball (B2B) minimum spacing of 60 µm, there is insufficient space to place a mount stud.

Disclosed methods include forming solder caps on top of pillars that are on bond pads of a die, that includes changing the process flow from a conventional photoresist strip/etch before solder ball drop to the photoresist strip/etch after the solder ball drop. A heat resistant (or thermo resistant) material, such as a high temperature resistant photoresist, is used which enables removal of the heat resistant material after solder ball drop, since it can withstand the reflow processing. The heat resistant material defines a cavity around the bond pads that can improve solder ball placement (by being within the cavity) and also the solder reflow.

Disclosed aspects include a semiconductor die that includes a substrate including a semiconductor surface including circuitry electrically connected to die bond pads including a first die bond pad exposed by a passivation layer, a top dielectric layer over the passivation layer, and a metal layer, such as an RDL, that is electrically connected to the first die bond pad. A pillar is on the metal layer over the first die bond pad, and a solder cap is on a top side of the pillar. The solder cap includes an essentially vertical sidewall portion generally beginning at a top corner edge of the pillar.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Figure 2A:
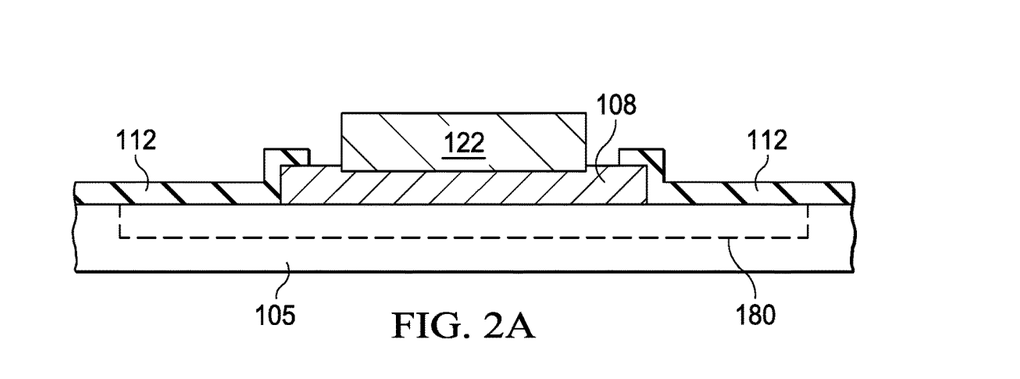
FIGS. 2A-H are successive views of an in-process semiconductor die corresponding to results following steps in an example method of forming a semiconductor die having a solder cap on the pillars, wherein the solder cap has a base (lower) portion that is essentially vertical/straight, according to an example aspect.
Figure 2B:
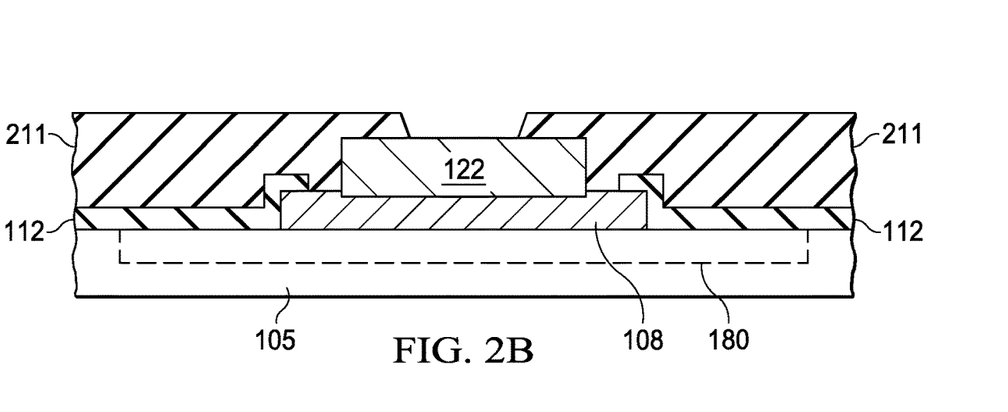

FIGS. 2A-H are successive views of an in-process semiconductor die shown by example as an WCSP die corresponding to results following steps in an example method of forming a semiconductor die having a solder cap on the pillars, wherein the solder cap has a base (lower) portion that is essentially vertical, according to an example aspect. FIG. 2A shows results after forming a RDL 122 over a first die bond pad 108 on a substrate 105 comprising a semiconductor surface including circuitry 180 electrically connected to die bond pads including the first die bond pad 108 exposed by a passivation layer 112. A seed layer generally used under the RDL 122 is not shown for simplicity. The RDL 122 includes a first trace (not shown) electrically connected to a portion that may be referred to as being a contact pad over the RDL 122 which is on top of the first die bond pad 108. FIG. 2B shows results after forming a top dielectric layer 211 (generally comprising a polyimide) over the passivation layer 112 with an aperture over the first die bond pad 108.

Figure 2C:
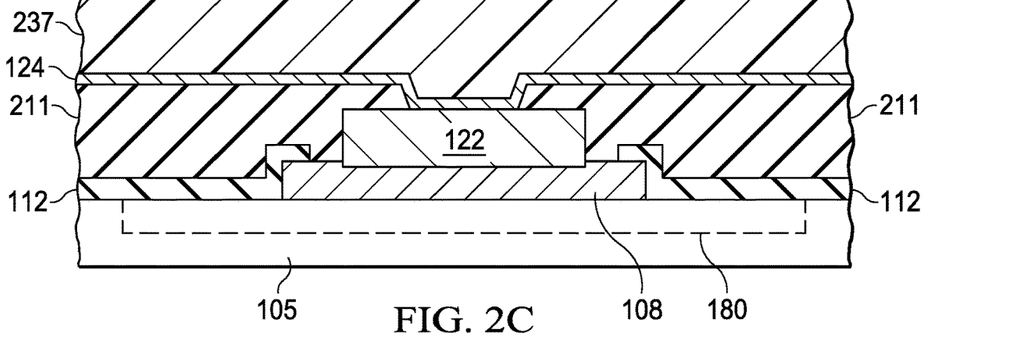
Figure 2D:
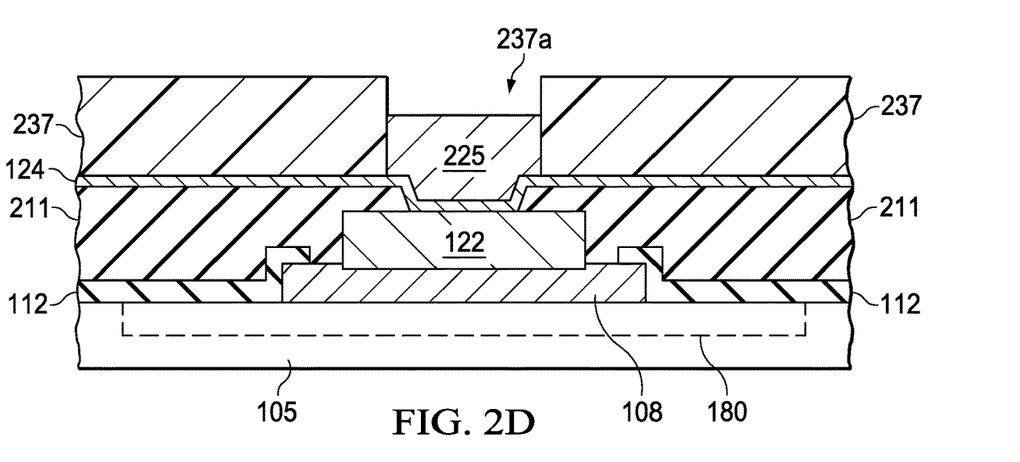

FIG. 2C shows results after forming a seed layer 124 then a heat resistant coating 237 (that is generally a photoresist) on the seed layer 124, and FIG. 2D shows results after patterning the heat resistant coating 237 to define a cavity 237a with an essentially vertical sidewall again meaning the sidewall is an angle of 85 deg+/−5 degs relative to a top surface of the substrate 105, wherein the cavity 237a is over a top surface of the first die bond pad 108, and then forming a pillar 225 that electrically contacts the RDL 122. The cavity 237a around the bond pads can improve solder ball placement by being within the cavity and also the solder reflow. The typical reflow temperature range for Pb-Free (Sn/Ag) solder is generally 240-250° C. with 40-80 seconds at a temperature over 220° C.

The heat resistant coating 237 can be a material other than photoresist, such as a silicon compound, for example, silicon oxide. As used herein, a heat resistant coating is a coating that can withstand a temperature of at least 250° C. without measurable deformation, and also can be removed after reflow. In the case of a photoresist, the heat resistant coating in one specific example can be the material marketed as THB-151N (a negative tone photoresist) obtainable from JSR Micro Inc.

Figure 2E:
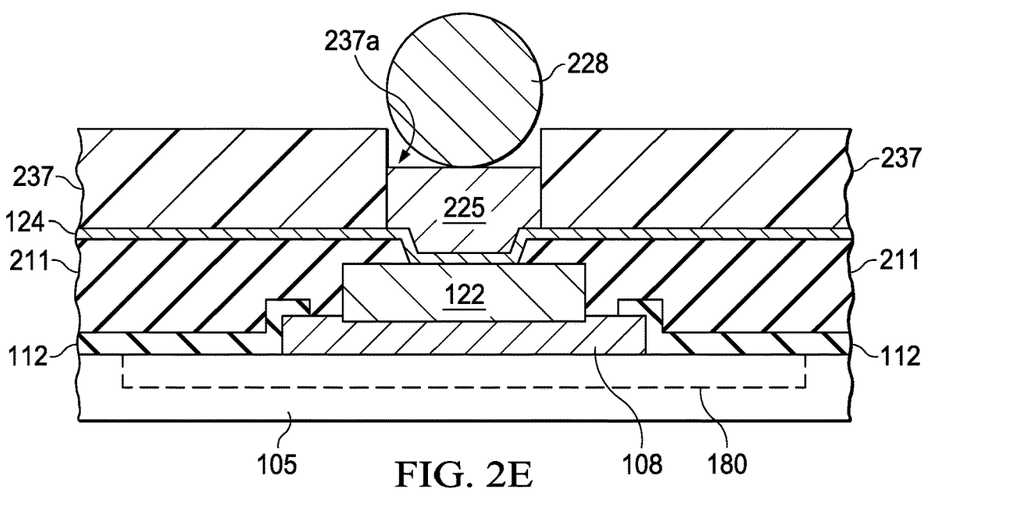
Figure 2F:
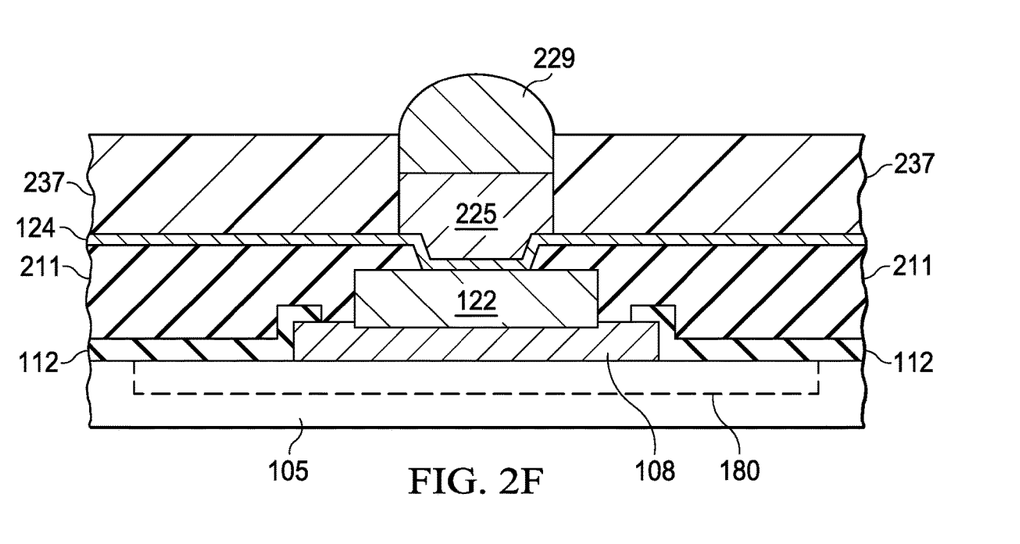

FIG. 2E shows results after a solder ball 228 is formed on a top surface of the pillar 225 and FIG. 2F shows results following a reflow step that due to solder reflow conforms the solder to the shape of the cavity 237a (which has 85 deg+/−5 deg sidewalls), where the solder after reflow is now referred to as being a solder cap 229. The solder cap 229 can be seen to have taken on its shape having essentially vertical sidewalls beginning at a top corner edge of the pillar 225 from the cavity 237a described above defined by the heat resistant coating 237.

Figure 2G:
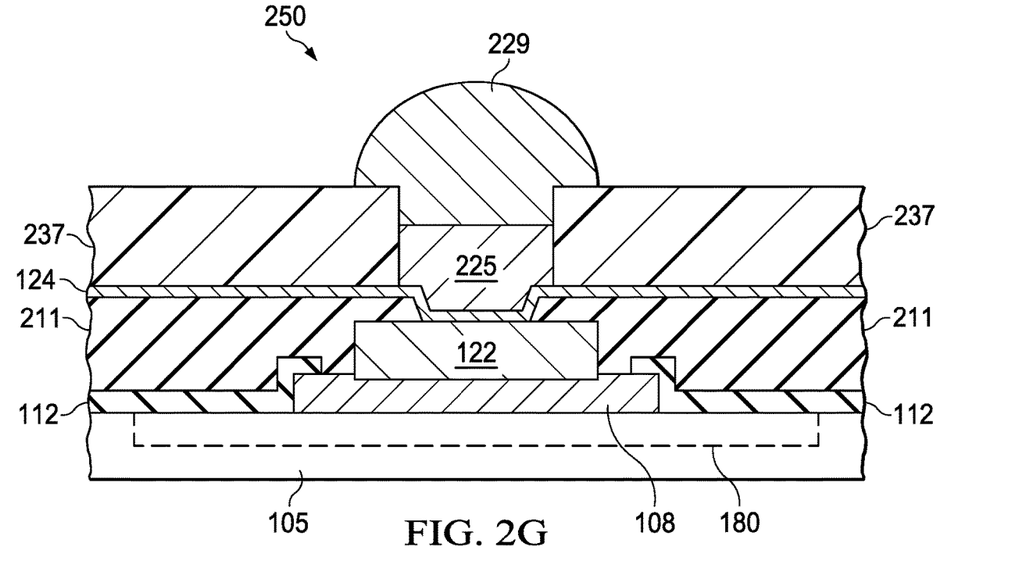

FIG. 2G. shows the solder cap 229 having a mushroom shape, the presence of this feature depending on the thickness of the heat resistant coating 237. If the thickness of the heat resistant coating 237 is >100 μm, then no mushroom shape will generally be present since the solder volume will generally not be enough to flow over the surface of the heat resistant coating 237, as shown in FIG. 2G. If the thickness of the heat resistant coating 237 is <100 μm, then, depending on how much heat resistant coating is <100 μm, one can generally expect either a slight rounding of the top of the solder cap 229, as shown in FIG. 2F, or a mushroom shape of the solder cap 229, as shown in FIG. 2G, when the heat resist coating 237 is less than it is in FIG. 2F. Moreover, the same flatness, rounding or mushrooming of the tip surface of solder cap 229 could also be obtained by varying the amount of solder in proportion to the thickness of the heat resistant coating 237.

Figure 2H:
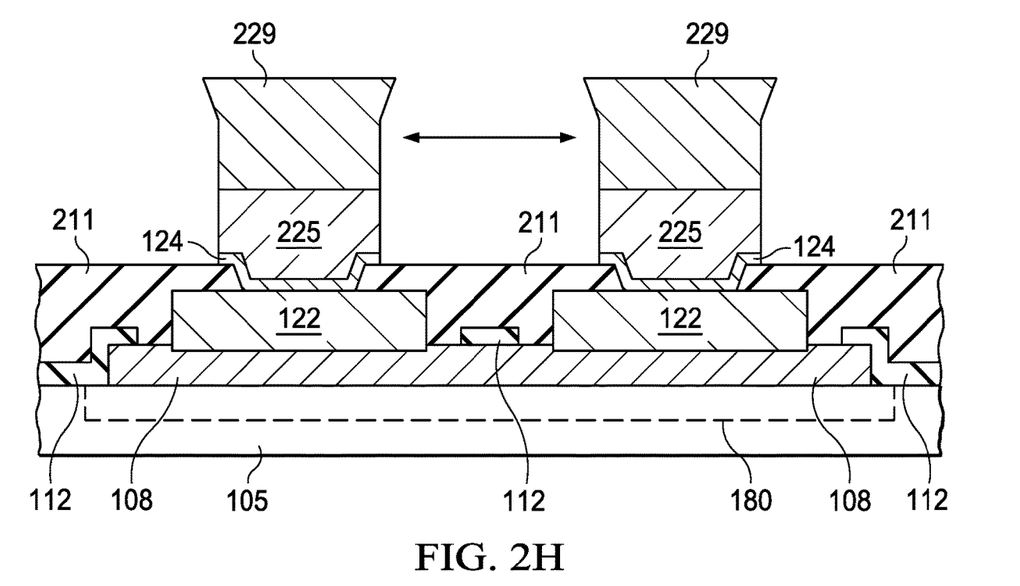

After the reflow step that generally includes a peak temperature of at least 240° C., as shown in FIG. 2H as being semiconductor die 250 which adds another identical bonding structure as in FIG. 2E including a disclosed solder cap 229, the heat resistant coating 237 is removed, and the seed layer 124 is etched. The solder cap 229 as noted above due to the presence of the cavity 237a being a confining structure at the time of the reflow still includes the essentially vertical sidewall portion beginning at a top corner edge of the pillar 225. The minimum distance between the respective solder caps 229 can be no more than 60 μm. When this distance is less than 60 μm, there may be solder ball drop challenges both in the hardware process and in the integrity (ball to ball isolation) of the solder ball placement.

Figure 3A:
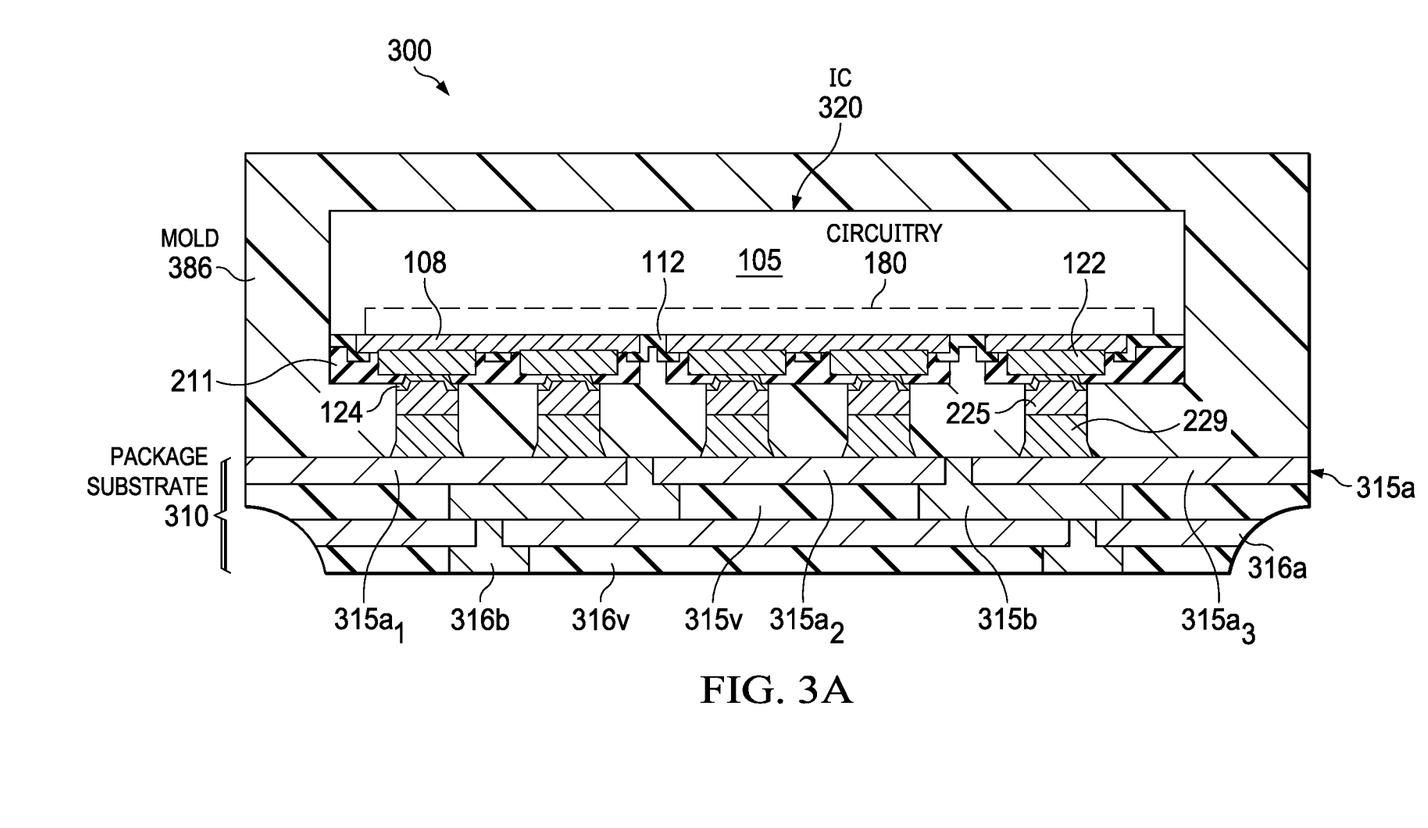
FIG. 3A is a cross-sectional view of an example flipchip package including solder capped pillars on bond pads, with a solder cap that has a base portion that is essentially vertical on top of the pillars, according to an example aspect. The die is shown mounted on a package substrate shown as a multi-level package substrate.

FIG. 3A is a cross-sectional view of an example flipchip package 300 including a semiconductor die 320 including pillars 225 on an RDL 122 on bond pads 108 of a substrate 105 having circuitry 180, with a solder cap 229 that has a base portion that is essentially vertical on top of the pillars 225, according to an example aspect. The package 300 is shown mounted on bonding features (metal pads) 315a1, 315a2, 315a3 of a top layer of a multi-level package substrate 310 including a top metal layer 315a having an associated top dielectric layer 315b and vias 315v. The flipchip package 300 also includes a mold material 386 covering the semiconductor die 320 and a top surface of package substrate 310.

FIG. 3A (and FIG. 3B described below) show the optional feature of the straight sidewalls on the solder caps 229 being maintained (not deformed) even after another reflow process is implemented, in the case of flipchip package 300 to reflow the solder in solder caps 229 to attach to metal pads 315a1, 315a2, 315a3 of the multi-level packet substrate retention. The straight sidewall portion of the solder caps 229 can be deformed by this subsequent reflow. There are also methods to maintain the straight wall structures for the solder cap 229 after the subsequent reflow, one example being to limit the flux dip depth (such as a depth between 10 and 40 μm) to only wet around the tip of solder instead of submerging the whole solder structure. The subsequent reflow will generally remove the mushroom shape of the solder cap 229 if it is present at the subsequent reflow.

The multi-level package substrate 310 can be a printed circuit board (PCB). The multi-level package substrate 310 also includes a bottom layer including a bottom metal layer 316a including metal features having an associated bottom dielectric layer 316b and vias 316v.

Figure 3B:
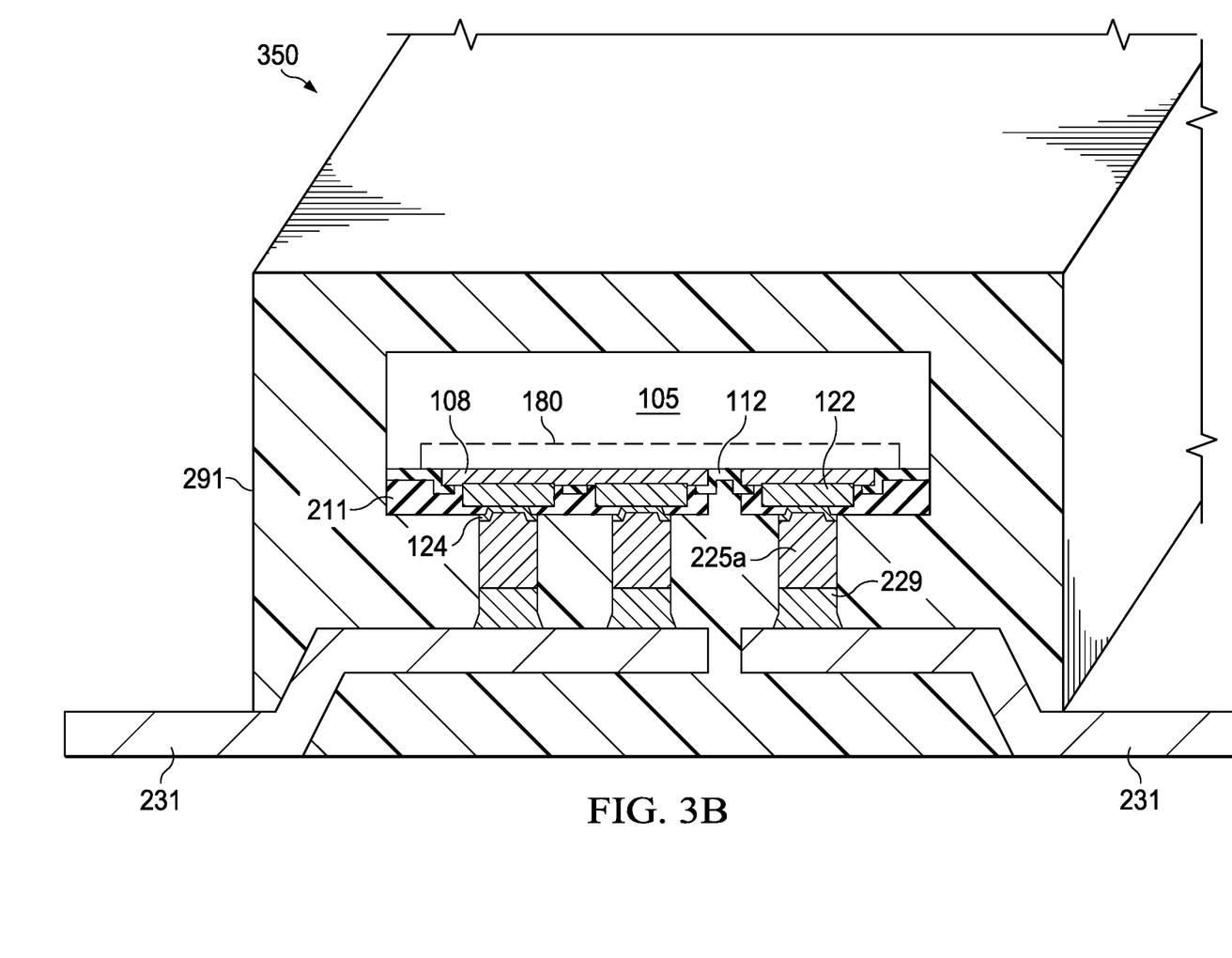
FIG. 3B is a cross-sectional view of an example flipchip package including pillars on bond pads, with a solder cap that has a base portion that is essentially vertical on top of the pillars, according to an example aspect. The package substrate is shown as a leadframe, where the package is shown by example as being a flipchip on lead package.

FIG. 3B is a cross-sectional view of an example flipchip package 350 including pillars shown as 225a (having an "a" added to the reference number due to their relatively tall height relative to the pillars 225 described above), on an RDL 122 on bond pads 108 of a substrate 105 having circuitry 180, with a solder cap 229 that has a base portion that is essentially vertical on top of the pillars 225a, according to an example aspect. The flipchip package 350 is shown including a leadframe including leads 231 shown by example as being a flipchip on lead package. The flipchip package 350 also includes mold material 291 covering substrate 105, an outer surface of passivation layer 112, at least two side surfaces of dielectric layer 211, pillars 225a, solder caps 229 and portions of leads 231 attached to solder caps 229. Besides flipchip packages disclosed aspects can also be applied to the flipchip bonding portion for hybrid wirebond/flipchip packages.

Disclosed aspects can be identified by the solder cap structure on the pillar where the base (lower portion) of the solder cap is essentially vertical since the solder cap is formed from a reflow process performed before removal of temperature resistant photoresist or other temperature resistant material that provided a cavity with essentially vertical walls over the pillar for the solder ball placement.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A semiconductor die, comprising:
   a substrate comprising a semiconductor surface including circuitry electrically connected to die bond pads including a first die bond pad exposed by a passivation layer, a top dielectric layer over the passivation layer, and a metal layer electrically connected to the first die bond pad;
   a pillar on the metal layer over the first die bond pad, and a solder cap on a top side of the pillar,
   wherein the solder cap includes an essentially vertical sidewall portion.

2. The semiconductor die of claim 1, wherein the metal layer comprises a redistribution layer (RDL).

3. The semiconductor die of claim 1, further comprising a seed layer over the passivation layer.

4. The semiconductor die of claim 1, wherein the solder cap includes a first solder cap and a second solder cap on separate ones of the die bond pads, and wherein the first solder cap and the second solder cap are separated from one another by no more than 60 µm.

5. The semiconductor die of claim 1, wherein the essentially vertical sidewall portion is at an angle of 85° plus or minus 5° relative to a normal drawn from a top surface of the semiconductor die beginning at a top corner edge of the pillar.

6. The semiconductor die of claim 1, wherein the top dielectric layer comprises a polyimide.

7. A semiconductor package, comprising:
   a semiconductor die, comprising:
      a substrate comprising a semiconductor surface including circuitry electrically connected to die bond pads including a first die bond pad exposed by a passivation layer, a top dielectric layer over the passivation layer, and a metal layer electrically connected to the first die bond pad;
      a pillar on the metal layer over the first die bond pad;
      a solder cap on a top side of the pillar, wherein the solder cap includes an essentially vertical sidewall portion, and
   a package substrate having bonding features, wherein the solder cap is flipchip mounted on the bonding features.

8. The semiconductor die of claim 7, wherein the package substrate comprises a multi-level package substrate.

9. The semiconductor die of claim 7, wherein the package substrate comprises a leadframe including leads.

10. The semiconductor die of claim 1, further including a metal pad of a package substrate coupled to the solder cap.

11. The semiconductor die of claim 10, wherein the metal pad is part of a top metal layer of the package substrate.

12. The semiconductor die of claim 11, wherein a dielectric layer is attached to a bottom side of the top metal layer.

13. The semiconductor die of claim 12, further including a bottom metal layer attached to a bottom side of the dielectric layer.

14. The semiconductor die of claim 13, further including conductive vias coupling the top metal layer to the bottom metal layer of the package substrate.

15. The semiconductor die of claim 13, wherein the semiconductor die and the package substrate form a flip chip package.

16. The semiconductor package of claim 7, wherein a metal pad of the package substrate is coupled to the solder cap.

17. The semiconductor package of claim 16, wherein the metal pad is part of a top metal layer of the package substrate.

18. The semiconductor package of claim 17, wherein a dielectric layer is attached to a bottom side of the top metal layer.

19. The semiconductor package of claim 18, further including a bottom metal layer attached to a bottom side of the dielectric layer.

20. The semiconductor package of claim 19, further including conductive vias coupling the top metal layer to the bottom metal layer of the package substrate.

* * * * *